(12) United States Patent
Sekiya

(10) Patent No.: US 7,960,250 B2
(45) Date of Patent: Jun. 14, 2011

(54) METHOD FOR MANUFACTURING DEVICE

(75) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 683 days.

(21) Appl. No.: 12/061,867

(22) Filed: Apr. 3, 2008

(65) Prior Publication Data

US 2008/0251188 A1 Oct. 16, 2008

(30) Foreign Application Priority Data

Apr. 12, 2007 (JP) ................................ 2007-104916

(51) Int. Cl.
*H01L 21/46* (2006.01)
(52) U.S. Cl. ................. 438/462; 438/458; 257/E21.599
(58) Field of Classification Search .......... 438/458–460, 438/462–464, 113; 257/E21.599
See application file for complete search history.

(56) References Cited

U.S. PATENT DOCUMENTS 5,888,883 A * 3/1999 Sasaki et al. .................. 438/460
6,638,865 B2 10/2003 Tanaka

FOREIGN PATENT DOCUMENTS

JP 2000-182995 6/2000
JP 2002-118081 4/2002

OTHER PUBLICATIONS

English language Abstract of JP 2000-182995, Jun. 30, 2000.

\* cited by examiner

*Primary Examiner* — David Vu
(74) *Attorney, Agent, or Firm* — Greenblum & Bernstein P.L.C.

(57) ABSTRACT

A method for manufacturing a device, in which a wafer having a plurality of devices formed on the face thereof is divided into the individual devices, and an adhesive film is mounted on the back side of each device. This method comprises: a cutting groove forming step of cutting the back side of the wafer along predetermined division lines by a cutting blade to form cutting grooves, while leaving an uncut portion, which is thinner than the target thickness of the device, on the front side of the wafer; a back side grinding step of grinding the back side of the wafer to the target thickness of the device, while allowing the cutting grooves to remain in the back side of the wafer; an adhesive film mounting step of mounting an adhesive film to the back side of the wafer; a wafer supporting step of sticking the adhesive film side of the wafer, on which the adhesive film has been mounted, to the surface of a dicing tape; a wafer severing step of cutting the front side of the wafer along the predetermined division lines by a cutting blade to sever the uncut portion, thereby dividing the wafer into the individual devices and cutting the adhesive film; and an adhesive film separating step of expanding the dicing tape to separate the adhesive film per device.

3 Claims, 9 Drawing Sheets

(a)

(b)

(a)

(b)

(a)

(b)

(c)

(a)

(b)

(c)

(a)

(b)

METHOD FOR MANUFACTURING DEVICE

FIELD OF THE INVENTION

This invention relates to a method for manufacturing a device, by which a wafer having devices formed in a plurality of regions defined by predetermined division lines formed in a lattice pattern on the surface of the wafer is divided into the individual devices along the predetermined division lines, and an adhesive film for die bonding is mounted on the back side of each device.

DESCRIPTION OF THE PRIOR ART

In a semiconductor device manufacturing process, for example, devices, such as IC's and LSI's, are formed in a plurality of regions defined by streets (predetermined division lines) formed in a lattice pattern on the surface of a nearly disk-shaped semiconductor wafer, and the respective regions having the devices formed therein are divided along the predetermined division lines to produce the individual devices. A cutting apparatus, called a dicing apparatus, is generally used as a dividing apparatus for dividing the semiconductor wafer. This cutting apparatus cuts the semiconductor wafer along the predetermined division lines by a cutting blade having a thickness of the order of 40 μm. The devices produced by such division are packaged, and widely used in electrical equipment including cellular phones and personal computers.

The individually divided devices each have an adhesive film for die bonding mounted on the back side of the device, the adhesive film being formed from an epoxy resin or the like, having a thickness of 70 to 80 μm, and called a die attach film. The device is bonded via the adhesive film to a die bonding frame, which supports the device, by heating. A method for mounting the die bonding adhesive film to the back side of the device is disclosed in JP-A-2000-182995. This method comprises sticking the adhesive film to the back side of the semiconductor wafer, sticking the semiconductor wafer to a dicing tape via the adhesive film, and then severing the adhesive film, together with the semiconductor wafer, by the cutting blade along the predetermined division lines formed on the surface of the semiconductor wafer to form the devices having the adhesive film mounted on the back side thereof.

However, severing the adhesive film, together with the semiconductor wafer, by the cutting blade to divide the wafer into the individual devices poses the problem that chipping occurs in the back side of the device.

In recent years, a lighter weight and a smaller size have been demanded of electrical equipment, including cellular phones and personal computers, and thinner devices have been desired. A dividing technique, called the DBG (dicing before grinding) method, has been put to practical use as a technique for dividing the semiconductor wafer into thinner devices. The DBG method is a technology in which division grooves of a predetermined depth (a depth corresponding to the target thickness of the device) are formed along the predetermined division lines in the surface of the semiconductor wafer, whereafter the back side of the semiconductor wafer having the division grooves formed in the surface thereof is ground to expose the division grooves at the back side, thereby dividing the semiconductor wafer into the individual devices. According to this technology, the thickness of the device can be reduced to 100 μm or less, without occurrence of chipping at the back side of the device.

In dividing the semiconductor wafer into the individual devices by the above-mentioned DBG method, however, the division grooves of the predetermined depth are formed in the surface of the semiconductor wafer along the predetermined division lines, whereafter the back side of the semiconductor wafer is ground to expose the division grooves at the back side. Thus, the adhesive film for die bonding cannot be mounted, beforehand, on the back side of the semiconductor wafer. Hence, when the device produced by the DBG method is bonded to the die bonding frame, this bonding has to be performed, with a bonding agent being inserted between the device and the die bonding frame, thus arousing the problem that a bonding operation cannot be carried out smoothly.

To solve such a problem, proposals have been made for a method for manufacturing a semiconductor device, in which an adhesive film for die bonding is mounted on the back side of a semiconductor wafer divided into individual devices by the DBG method, the semiconductor wafer is stuck to a dicing tape via the adhesive film, and then portions of the adhesive film exposed in the clearances between the devices are cut by a cutter; and a method for manufacturing a semiconductor device, in which the portions of the adhesive film exposed in the clearances between the devices are irradiated with a laser beam from the front side of the devices through the clearances to remove the portions of the adhesive film exposed in the clearances. These proposed methods are disclosed in JP-A-2002-118081.

However, if the back side of the semiconductor wafer is ground until the division grooves are exposed when the semiconductor wafer is to be divided into the individual devices by the DBG method, the individually divided devices move, whereby the straightly cut division grooves are contorted. It is difficult to relatively move the cutter, which has bee inserted into the division grooves, along the contorted division grooves. It is also difficult to perform irradiation with the laser beam along the contorted division grooves.

SUMMARY OF THE INVENTION

It is an object of the present invention to provide a method for manufacturing a device, the device having an adhesive film for die bonding mounted on the back side of the device, without lowering the quality of the device.

According to the present invention, as a method for attaining the above object, there is provided a method for manufacturing a device, in which a wafer having devices formed in a plurality of regions defined by predetermined division lines formed in a lattice pattern on the surface of the wafer is divided into the individual devices along the predetermined division lines, and an adhesive film for die bonding is mounted on the back side of each device, the method comprising:

a cutting groove forming step of cutting a back side of the wafer along the predetermined division lines by a cutting blade to form cutting grooves, while leaving an uncut portion, which is thinner than the target thickness of the device, on the front side of the wafer;

a back side grinding step of grinding the back side of the wafer, which has been subjected to the cutting groove forming step, to the target thickness of the device, while allowing the cutting grooves to remain in the back side of the wafer;

an adhesive film mounting step of mounting an adhesive film to the back side of the wafer which has been subjected to the back side grinding step;

a wafer supporting step of sticking the adhesive film side of the wafer, on which the adhesive film has been mounted, to the surface of a dicing tape mounted on an annular frame;

a wafer severing step of cutting the front side of the wafer, which has been stuck to the surface of the dicing tape via the adhesive film, along the predetermined division lines by a cutting blade to sever the uncut portion, thereby dividing the wafer into the individual devices and cutting the adhesive film; and an adhesive film separating step of expanding the dicing tape, after performing the wafer severing step, to separate the adhesive film per device.

It is desirable that the thickness of the cutting blade for cutting in the wafer severing step be set to be thinner than the thickness of the cutting blade for cutting in the cutting groove forming step. Preferably, the adhesive film is completely severed during the wafer severing step.

According to the present invention, when the wafer severing step is carried out, the uncut portion remains on the front side of the wafer, so that the cutting grooves are kept straight. Thus, the wafer can be cut along the cutting grooves by the cutting blade. In the wafer severing step, moreover, chipping does not occur at the back side of the divided device, since the cutting grooves have already been formed during the cutting groove forming step in the back side of the wafer in the regions to be cut by the cutting blade. Particularly in case the thickness of the cutting blade for performing the wafer severing step is thinner than the thickness of the cutting blade which has performed the cutting groove forming step, the cutting blade does not contact the surroundings of the back side of the device to be cut. Thus, chipping can be reliably prevented from occurring in the back side of the device.

DETAILED DESCRIPTION OF THE PREFERRED EMBODIMENTS

Preferred embodiments of the method for manufacturing a device in accordance with the present invention will be described in detail by reference to the accompanying drawings.

Figure 1:
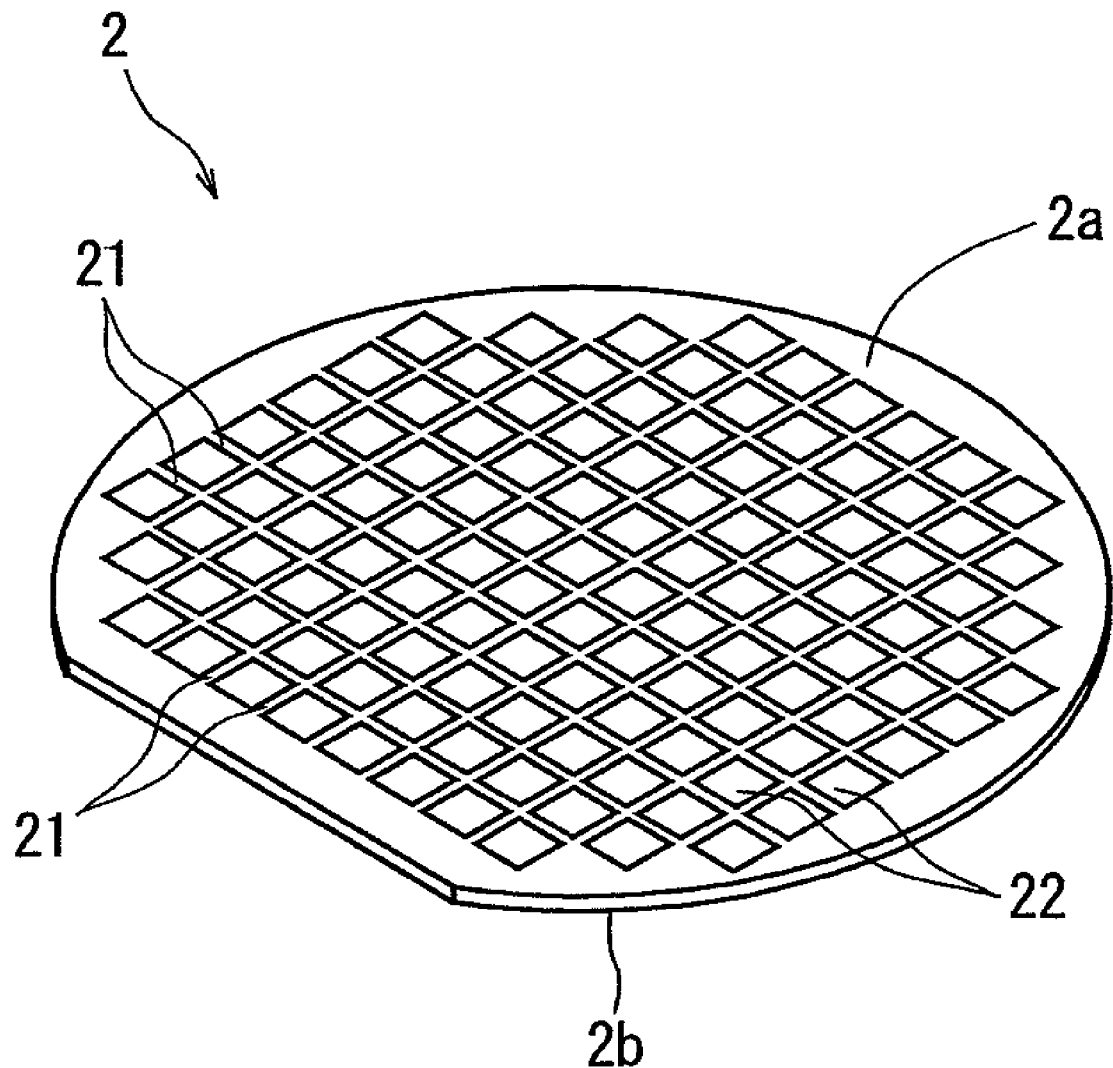
FIG. 1 is a perspective view showing a semiconductor wafer as a wafer.

FIG. 1 shows a perspective view of a semiconductor wafer as a wafer. A semiconductor wafer 2 shown in FIG. 1 comprises, for example, a silicon wafer having a thickness of 700 μm, and a plurality of predetermined division lines 21 are formed in a lattice pattern on the surface 2a of the semiconductor wafer 2. On the surface 2a of the semiconductor wafer 2, devices 22, such as IC's or LSI's, are formed in a plurality of regions defined by the plurality of predetermined division lines 21 formed in the lattice pattern.

Figure 2:
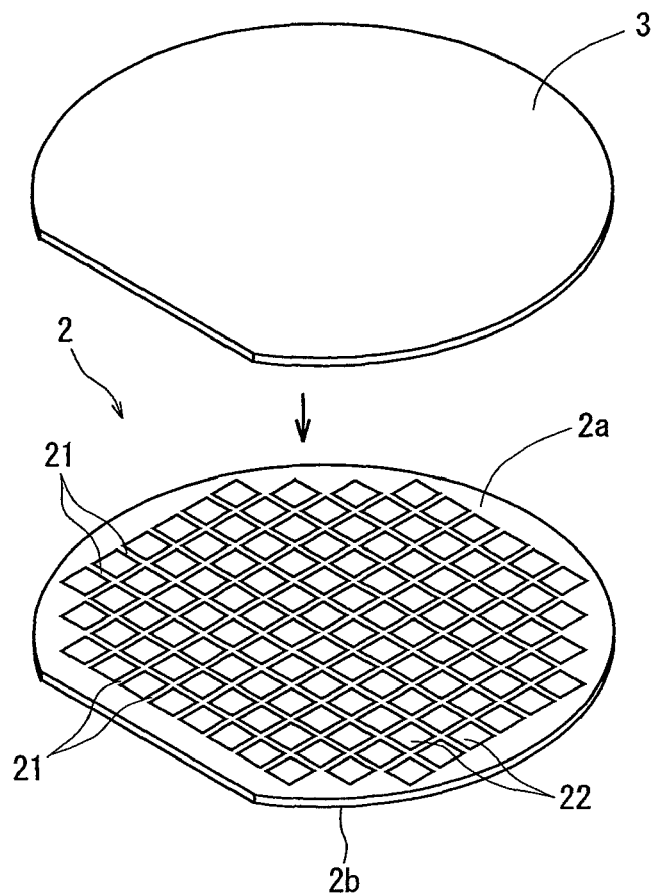
FIGS. 2(a) and 2(b) are explanation drawings of a protective tape sticking step of sticking a protective tape to the surface of the semiconductor wafer shown in FIG. 1.
Figure 2:
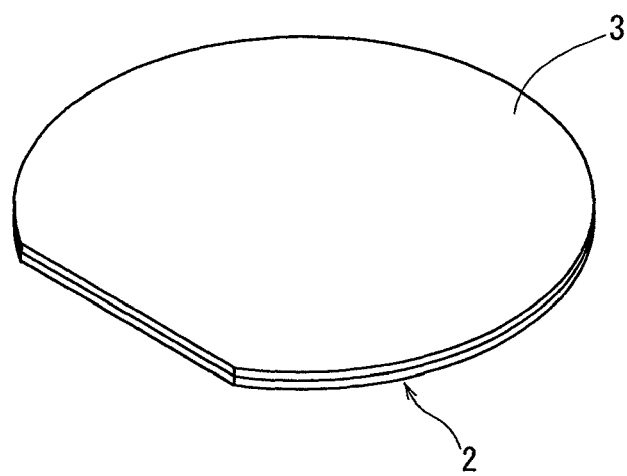

To produce the individual devices by dividing the above-mentioned semiconductor wafer 2 along the predetermined division lines 21, a first step is to stick a protective tape 3 to the surface 2a of the semiconductor wafer 2 (i.e., the surface where the devices 22 are formed), as shown in FIGS. 2(a) and 2(b) (this step is a protective tape sticking step). As the protective tape 3, a polyolefin sheet of 150 μm in thickness is used in the illustrated embodiment.

Figure 3:
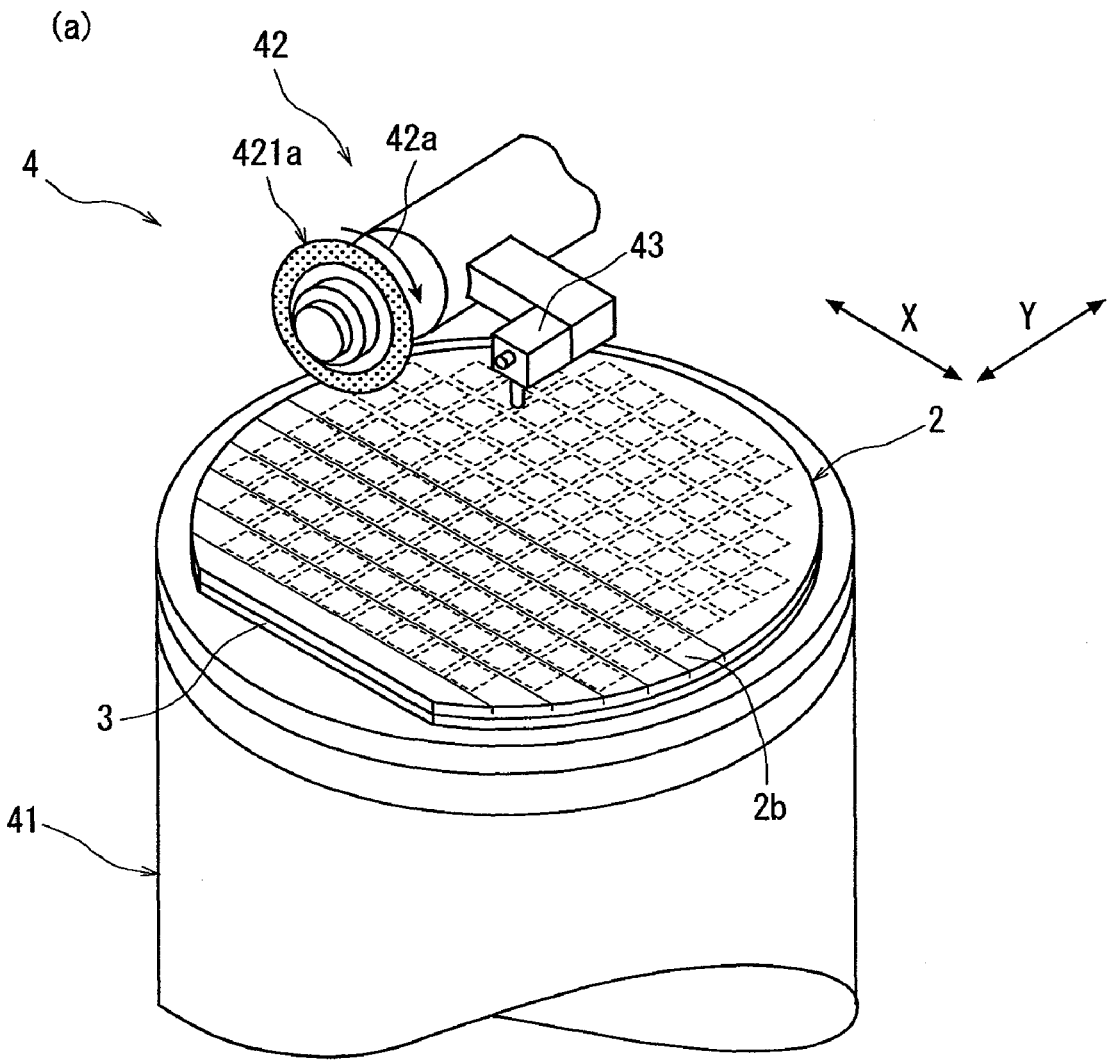
FIGS. 3(a) and 3(b) are explanation drawings of a cutting groove forming step in a method for manufacturing a device in accordance with the present invention.
Figure 3:
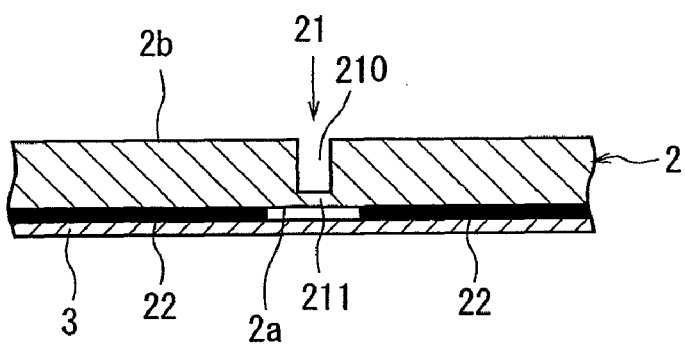

After the protective tape sticking step is performed, a cutting groove forming step is carried out in which the back side of the semiconductor wafer 2 is cut along the predetermined division lines 21 to form cutting grooves, while leaving on the front side an uncut portion thinner than the target thickness of the device 22. This cutting groove forming step is performed using a cutting apparatus 4 shown in FIG. 3(a). The cutting apparatus 4 shown in FIG. 3(a) is equipped with a chuck table 41 provided with a suction holding means, a cutting means 42 having a cutting blade 421a, and an imaging means 43. The cutting blade 421a used in the illustrated embodiment has a thickness of 50 μm. The imaging means 43 is composed of an infrared illumination means for irradiating a workpiece with infrared radiation, an optical system for capturing infrared radiation applied by the infrared illumination means, and an imaging device which outputs an electrical signal conformed to infrared radiation captured by the optical system (i.e., infrared CCD), in addition to an ordinary imaging device which forms an image by visible light (CCD).

To perform the cutting groove forming step using the so constituted cutting apparatus 4, the semiconductor wafer 2 is placed on the chuck table 41, with the protective tape 3 being pointed downward. Thus, the semiconductor wafer 2 held on the chuck table 41 has its back side 2b pointed upward. Then, the suction holding means (not shown) is actuated, whereby the semiconductor wafer 2 is attracted onto and held on the chuck table 41 via the protective tape 3. The chuck table 41, which has attracted (sucked) and held the semiconductor wafer 2 via the protective tape 3, is positioned directly below the imaging means 43 by a cutting feed mechanism (not shown).

After the chuck table 41 is positioned directly below the imaging means 43, an alignment operation is performed for detecting a cutting region of the semiconductor wafer 2, where cutting grooves are to be formed, by the imaging means 43 and a control means (not shown). That is, the imaging means 43 and the control means (not shown) perform image processing, such as pattern matching, for registering the predetermined division line 21 formed in a predetermined direction of the semiconductor wafer 2 with the cutting blade 421a, thereby performing the alignment of the cutting region (alignment step). Similarly, the alignment of the cutting region is also performed for the predetermined division line 21 extending perpendicularly to the predetermined division line 21 formed in the predetermined direction of the semiconductor wafer 2. On this occasion, the surface 2a of the semiconductor wafer 2, where the predetermined division line 21 is formed, is located on the lower side. However, the imaging means 43 is composed of the infrared illumination means, the optical system for capturing infrared radiation, and the imaging device for outputting an electrical signal conformed to infrared radiation (infrared CCD), as mentioned above. Thus, the predetermined division line 21 can be imaged through the back side 2b.

After completion of the alignment of the cutting region in the semiconductor wafer 2 held on the chuck table 41, the chuck table 41 having the semiconductor wafer 2 held thereon is moved to a cutting start position of the cutting region. Then, the cutting blade 421a is moved downward, while being rotated in a direction indicated by an arrow 42a in FIG. 3(a), to carry out a predetermined amount of infeeding (feeding for cutting into the semiconductor wafer). The position of infeeding is set at a position which the outer peripheral edge of the cutting blade 421a reaches after coming to a point corresponding to the target thickness of the device (i.e., 100 µm) measured from the surface of the semiconductor wafer 2 (undersurface) and further approaching the front side (for example, the position of infeeding is set at the position at a depth of 620 µm below the back side of the semiconductor wafer 2 (upper surface)). Upon infeeding of the cutting blade 421a performed in this manner, the cutting blade 421a is rotated at a rotational speed of, for example, 40,000 rpm, while the chuck table 41 is cutting-fed (fed for cutting the semiconductor wafer) at a cutting feed speed of, for example, 50 mm/second in a direction indicated by a double-headed arrow X in FIG. 3(a). As a result, a cutting groove 210 having a depth of 620 µm below the back side 2b is formed along the predetermined division line 21, as shown in FIG. 3(b). Thus, an uncut portion 211 of 80 µm in thickness remains adjacent to the surface 2a of the semiconductor wafer 2. This cutting groove forming step is performed along all the predetermined division lines 21 formed in the semiconductor wafer 2.

Figure 4:
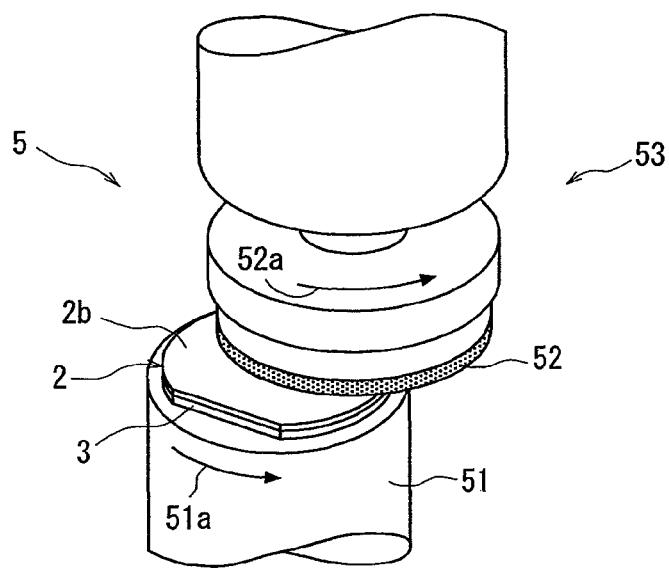
FIGS. 4(a), 4(b) and 4(c) are explanation drawings of a back side grinding step in the method for manufacturing a device in accordance with the present invention.
Figure 4:
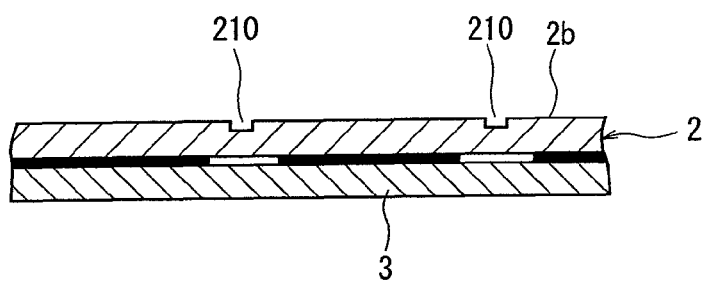
Figure 4:
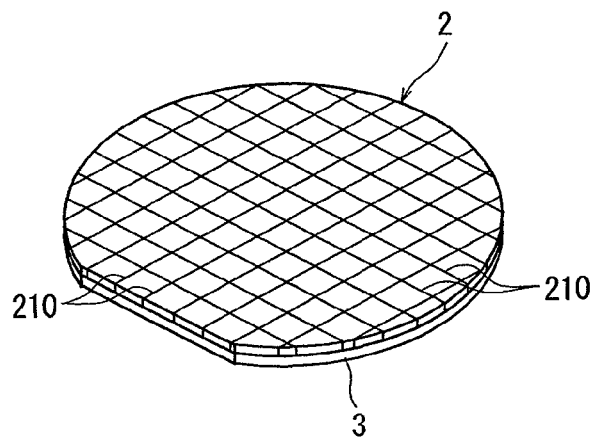

After execution of the above-described cutting groove forming step, the back side of the semiconductor wafer 2 is ground to the target thickness (e.g., 100 µm) of the device. This back side grinding step is carried out, in the illustrated embodiment, by a grinding apparatus 5 shown in FIG. 4(a). The grinding apparatus 5 shown in FIG. 4(a) is equipped with a chuck table 51 having a suction holding means, and a grinding means 53 having a grinding wheel 52. To carry out the back side grinding step by the so constituted grinding apparatus 5, the semiconductor wafer 2 is placed on the chuck table 51, with the protective tape 3 being pointed downward. Thus, the semiconductor wafer 2 held on the chuck table 51 has its back side 2b pointed upward. Then, while the chuck table 51 is rotated, for example, at 300 rpm in a direction indicated by an arrow 51a, the grinding wheel 52 of the grinding means 53 is rotated, for example, at 6000 rpm in a direction indicated by an arrow 52a and brought into contact with the back side 2b of the semiconductor wafer 2. By this means, the back side 2b of the semiconductor wafer 2 is ground until the thickness of the semiconductor wafer 2 is reduced, for example, to 100 µm which is the target thickness of the device. As a result, in the back side 2b of the semiconductor wafer 2, the first cutting grooves 210 remain at a depth of 20 µm, as shown in FIGS. 4(b) and 4(c). Grinding the back side 2b of the semiconductor wafer 2 in this manner eliminates chipping which occurred in the vicinity of portions in the back side on both sides of the first cutting groove 210 during the aforementioned cutting groove forming step.

Figure 5:
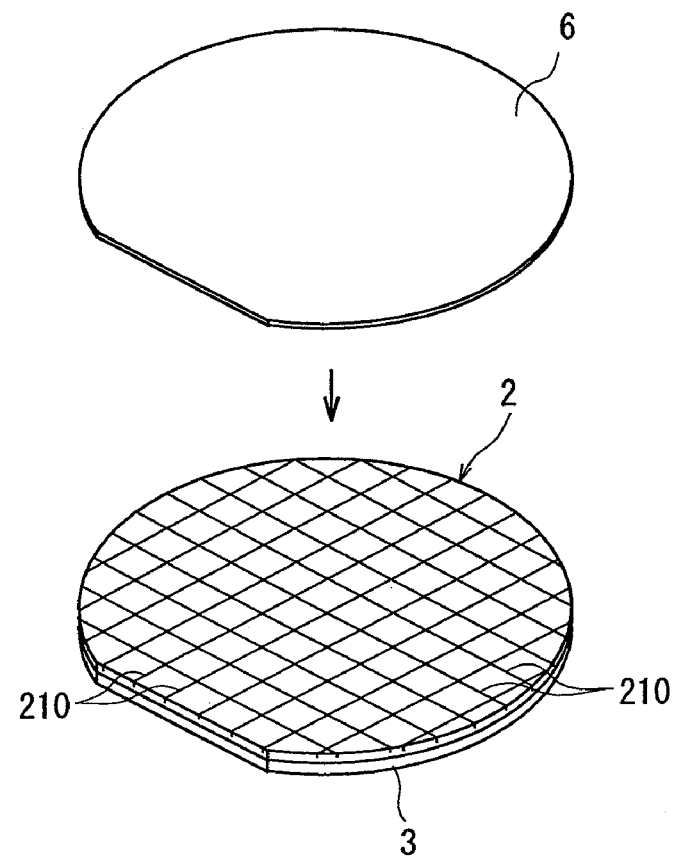
FIGS. 5(a) and 5(b) are explanation drawings of an adhesive film mounting step in the method for manufacturing a device in accordance with the present invention.
Figure 5:
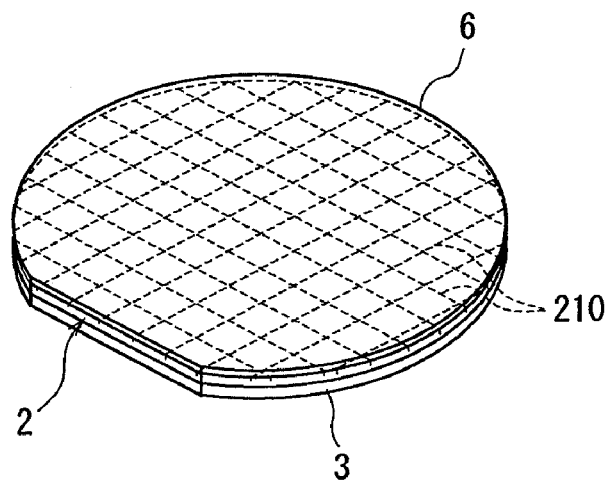

Then, an adhesive film mounting step is performed for mounting an adhesive film for die bonding on the back side 2b of the semiconductor wafer 2 subjected to the above back side grinding step. That is, an adhesive film 6 is mounted on the back side 2b of the semiconductor wafer 2, as shown in FIGS. 5(a) and 5(b). At this time, while being heated at a temperature of 80 to 200° C., the adhesive film 6 is pressed against the back side 2b of the semiconductor wafer 2 and stuck thereto.

Figure 6:
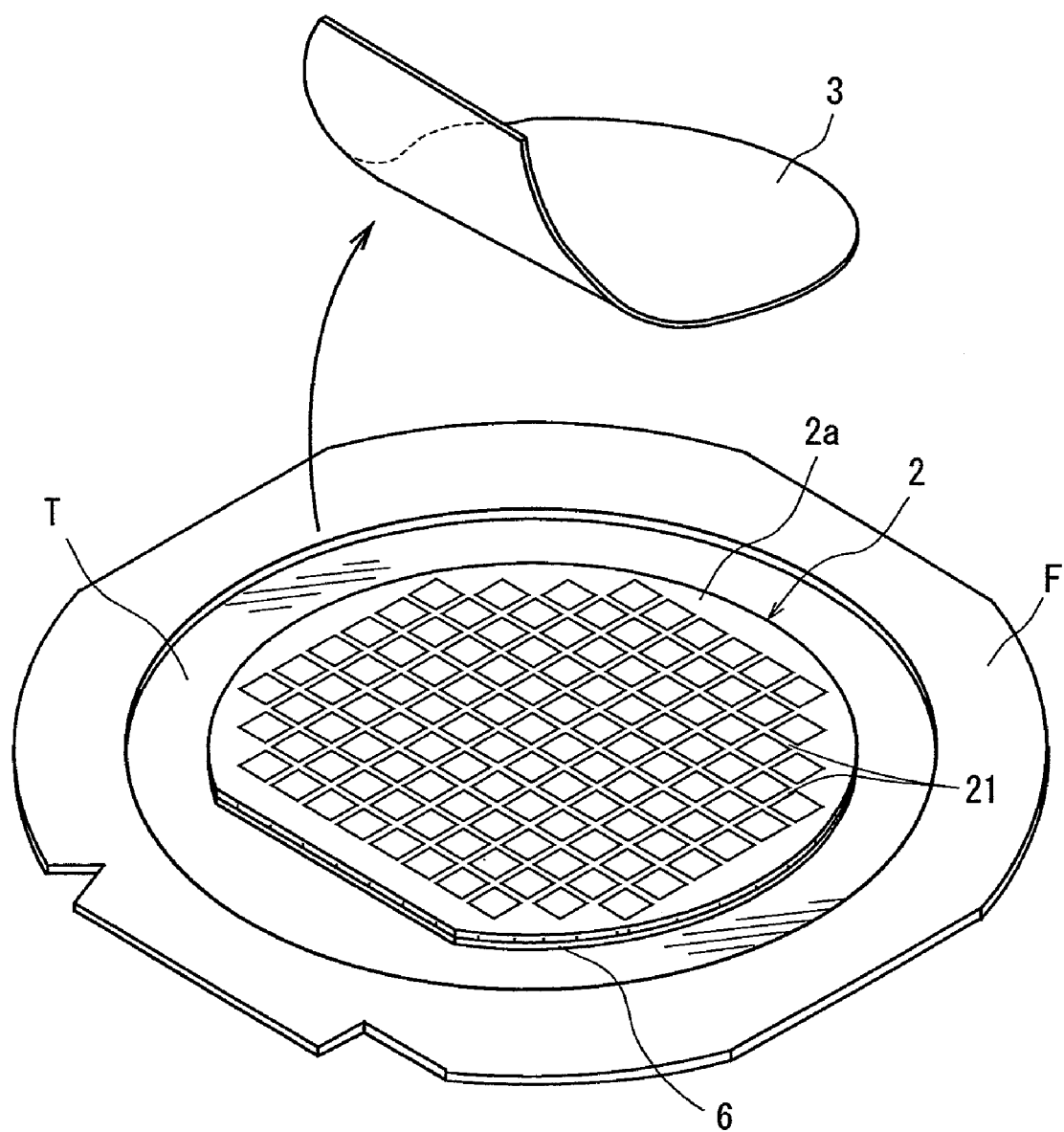
FIG. 6 is an explanation drawing of a wafer supporting step in the method for manufacturing a device in accordance with the present invention.

After the adhesive film mounting step is performed in the above-described manner, a wafer supporting step is performed for sticking the adhesive film 6 under the semiconductor wafer 2, on which the adhesive film 6 has been mounted, to the surface of a dicing tape T mounted on an annular frame F, as shown in FIG. 6. Then, the protective tape 3 stuck to the surface 2a of the semiconductor wafer 2 is peeled (protective tape peeling step). If an adhesive film-attached dicing tape, which is a dicing tape having an adhesive film stuck beforehand to its surface, is used, the adhesive film stuck to the surface of the dicing tape is mounted on the back side 2b of the semiconductor wafer 2 subjected to the above back side grinding step. Then, the above-mentioned protective tape peeling step is performed.

Figure 7:
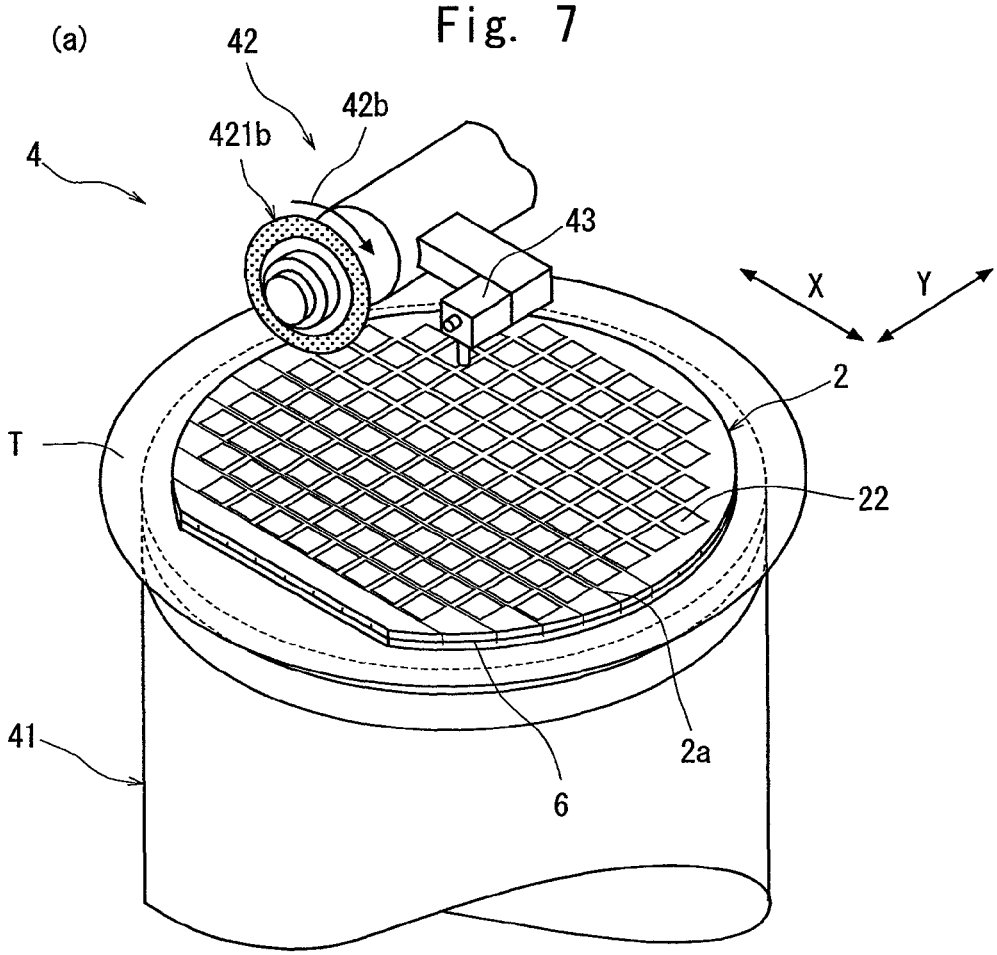
FIGS. 7(a), 7(b) and 7(c) are explanation drawings of a wafer severing step in the method for manufacturing a device in accordance with the present invention.
Figure 7:
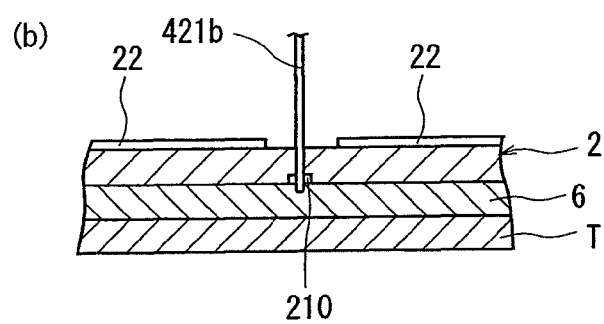
Figure 7:
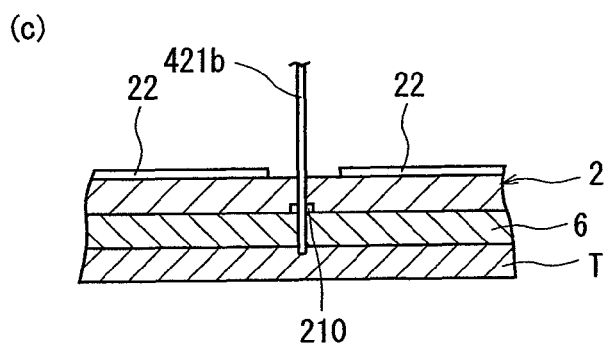

Then, a wafer severing step is performed for cutting the front side of the semiconductor wafer 2, which has been stuck to the surface of the dicing tape T via the adhesive film 6, along the predetermined division lines 21 to sever the aforesaid uncut portion 211, thereby dividing the semiconductor wafer 2 into the individual devices 22, and also cutting the adhesive film 6. This wafer severing step can be performed using the same cutting apparatus as the cutting apparatus 4 shown in FIG. 3(a), as shown in FIG. 7(a). A cutting blade 421b used on this occasion has a thinner thickness (20 µm) than the thickness (50 µm) of the cutting blade 421a used in the cutting groove forming step. To perform the wafer severing step, the dicing tape T having the semiconductor wafer 2 stuck thereto during the aforementioned wafer supporting step is placed on the chuck table 41 of the cutting apparatus 4, as shown in FIG. 7(a). Then, the suction holding means (not shown) is actuated, whereby the semiconductor wafer 2 is held on the chuck table 41 via the dicing tape T. Thus, the semiconductor wafer 2 held on the chuck table 4 has its surface 2a pointed upward. In FIG. 7(a), the annular frame F having the dicing tape T mounted thereon is omitted, and not shown, but the annular frame F is held by a suitable frame holding means disposed on the chuck table 41. The chuck table 41, which has thus attracted (sucked) and held the semiconductor wafer 2, is positioned directly below the imaging means 43 by the cutting feed mechanism (not shown).

After the chuck table 41 is positioned directly below the imaging means 43, an alignment operation is performed for detecting a region of the semiconductor wafer 2, which is to be cut, by the imaging means 43 and the control means (not shown), as in the aforementioned cutting groove forming step. That is, the imaging means 43 and the control means (not shown) register the predetermined division line 21 formed in a predetermined direction of the semiconductor wafer 2 with the cutting blade 421b.

After the predetermined division line 21 formed in the semiconductor wafer 2 held on the chuck table 41 is detected in the above manner to perform alignment of the cutting region, the chuck table 41 having the semiconductor wafer 2 held thereon is moved to the cutting start position of the cutting region. Then, the cutting blade 421b is moved downward, while being rotated in a direction indicated by an arrow 42b in FIG. 7(a), to carry out a predetermined amount of infeeding. The position of infeeding is set at a position where the outer peripheral edge of the cutting blade 421b reaches at least the adhesive film 6 mounted on the back side 2b of the semiconductor wafer 2, preferably, a position where the outer peripheral edge of the cutting blade 421b reaches the dicing tape T. Upon infeeding of the cutting blade 421b performed in this manner, the cutting blade 421b is rotated at a rotational speed of, for example, 40,000 rpm, while the chuck table 41 is cutting-fed at a cutting feed speed of, for example, 50 mm/second in a direction indicated by a double-headed arrow X in FIG. 7(a). As a result, the uncut portion 211 corresponding to the cutting groove 210 formed by the cutting groove forming step is severed, as shown in FIG. 7(b) or 7(c). If the infeeding position is set at the position where the outer peripheral edge of the cutting blade 421b reaches the adhesive film 6 mounted on the back side 2b of the semiconductor wafer 2, the adhesive film 6 is partially cut, as shown in FIG. 7(b). If the infeeding position is set at the position where the outer peripheral edge of the cutting blade 421b reaches the dicing tape T, the adhesive film 6 is completely severed, as shown in FIG. 7(c).

As described above, when the wafer severing step is carried out, the uncut portion 211 remains in the surface 2a of the semiconductor wafer 2, so that the cutting grooves 210 are kept straight. Thus, the semiconductor wafer 2 can be cut along the cutting grooves 210 by the cutting blade 421b. In the wafer severing step, moreover, chipping does not occur at the back side of the divided device, since the cutting grooves 210 have already been formed during the cutting groove forming step in the back side 2b (undersurface) of the semiconductor wafer 2 in the regions to be cut by the cutting blade 421b. Particularly in case the thickness of the cutting blade 421b for performing the wafer severing step is thinner than the thickness of the cutting blade 421a which has performed the cutting groove forming step, the cutting blade 421b does not contact the surroundings of the back side of the device 22 to be divided. Thus, chipping can be reliably prevented from occurring in the back side of the device.

Figure 8:
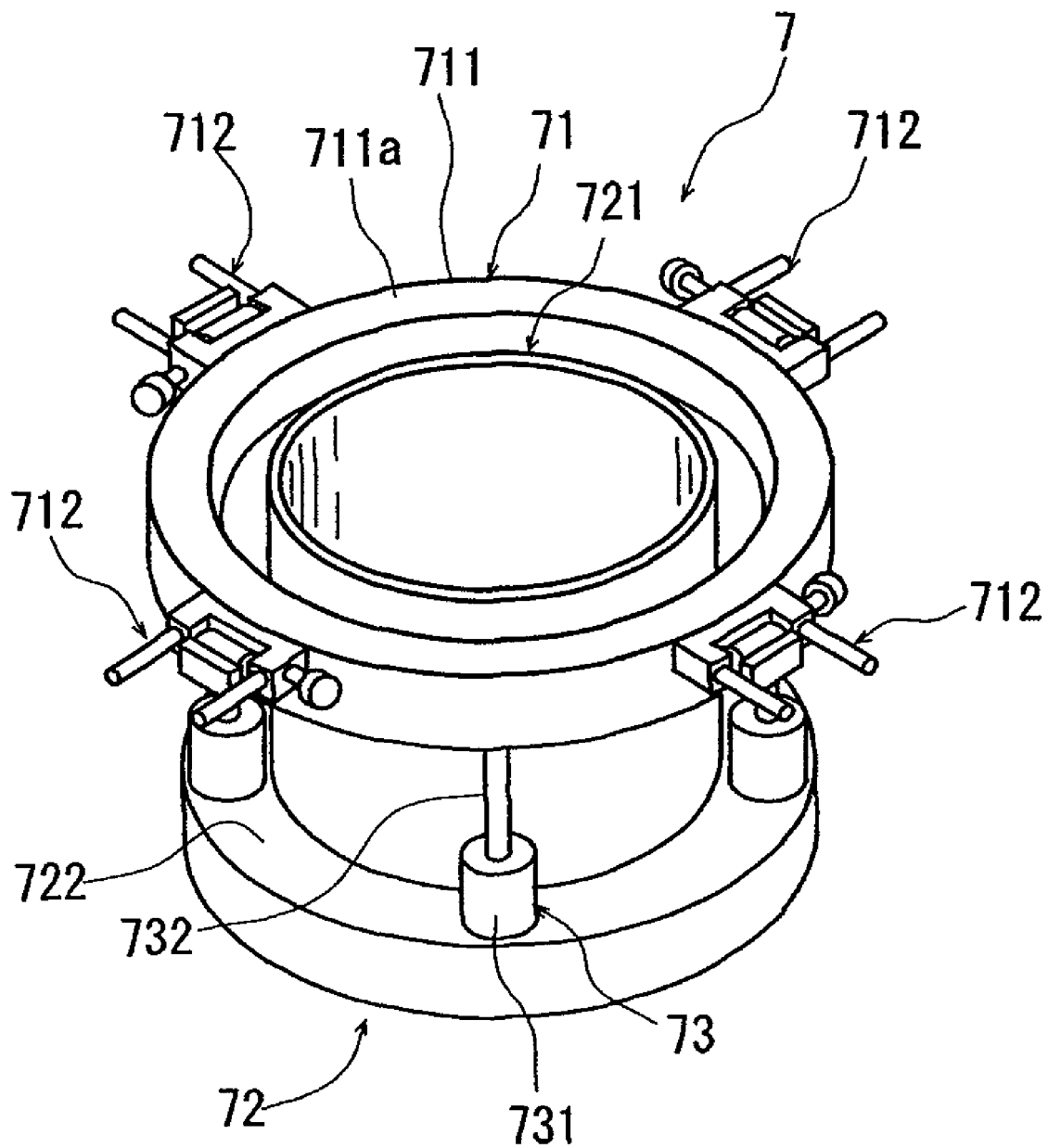
FIG. 8 is a perspective view of a tape expanding apparatus for performing an adhesive film separating step in the method for manufacturing a device in accordance with the present invention.

After the wafer severing step is performed in the above-described manner, an adhesive film separating step is performed for expanding the dicing tape T and separating the adhesive film 6 per device. This adhesive film separating step is performed, in the illustrated embodiment, with the use of a tape expanding apparatus 7 shown in FIG. 8. The tape expanding apparatus 7 shown in FIG. 8 is equipped with a frame holding means 71 for holding the annular frame F, and a tape expanding means 72 for expanding the dicing tape T mounted on the annular frame F held by the frame holding means 71. The frame holding means 71 comprises an annular frame holding member 711, and a plurality of clamps 712, as a fixing means, disposed on the outer periphery of the frame holding member 711. The upper surface of the frame holding member 711 forms a bearing surface 711a for placing the annular frame F thereon, and the annular frame F is placed on the bearing surface 711a. The annular frame F placed on the bearing surface 711a is fixed to the frame holding member 711 by the clamps 712. The so constituted frame holding means 71 is supported by the tape expanding means 72 so as to be movable upward and downward.

The tape expanding means 72 is equipped with an expanding drum 721 disposed inwardly of the annular frame holding member 711. The expanding drum 721 has an inner diameter and an outer diameter which are thinner than the inner diameter of the annular frame F and larger than the outer diameter of the wafer 2 stuck to the dicing tape T mounted on the annular frame F. Moreover, the expanding drum 721 has a support flange 722 at the lower end thereof. The tape expanding means 72 in the illustrated embodiment is equipped with a support means 73 capable of moving the annular frame holding member 711 upward and downward. The support means 73 comprises a plurality of air cylinders 731 disposed on the support flange 722, and a piston rod 732 of each of the air cylinders 731 is coupled to the lower surface of the annular frame holding member 711. The support means 73 composed of the plurality of air cylinders 731 as above moves the annular frame holding member 711 upward and downward between a reference position where the bearing surface 711a reaches nearly the same height as the upper end of the expanding drum 721, and an enlargement position where the bearing surface 711a is lower than the upper end of the expanding drum 721 by a predetermined amount. Thus, the support means 73 composed of the plurality of air cylinders 731 functions as an expanding moving means for moving the expanding drum 721 and the frame holding member 711 upward and downward relative to each other.

Figure 9:
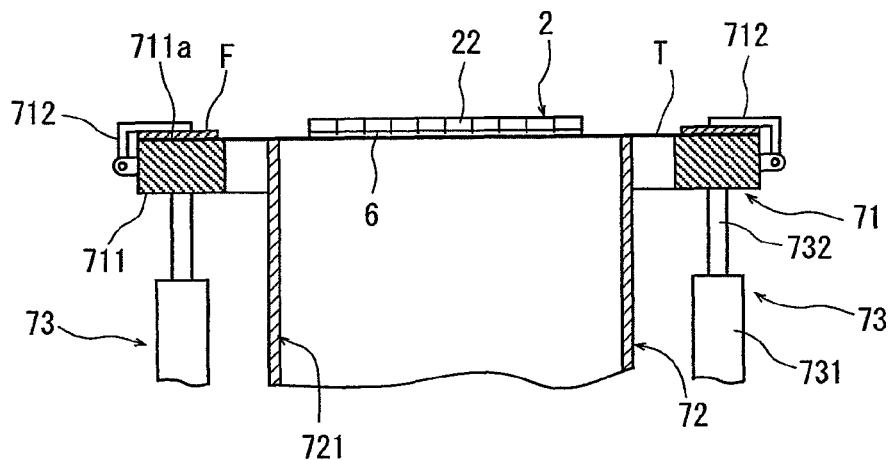
FIGS. 9(a) and 9(b) are explanation drawings showing the adhesive film separating step in the method for manufacturing a device in accordance with the present invention.
Figure 9:
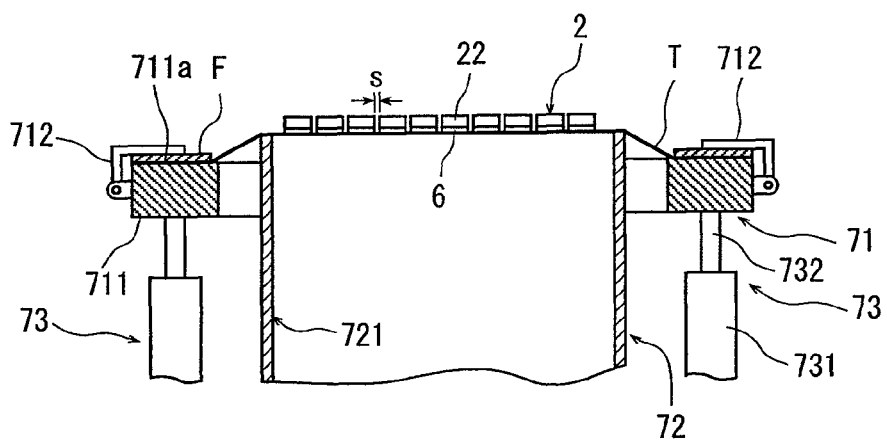

The adhesive film separating step, which is performed using the tape expanding apparatus 7 constituted as above, will be described by reference to FIGS. 9(a) and 9(b). That is, the annular frame F mounted with the dicing tape T having the adhesive film 6 in contact with the semiconductor wafer 2 (divided into the individual devices 22 along the predetermined division lines 21) stuck thereto is placed on the bearing surface 711a of the frame holding member 711 constituting the frame holding means 71, and is fixed to the frame holding member 711 by the clamps 712, as shown in FIG. 9(a). At this time, the frame holding member 711 is located at the reference position shown in FIG. 9(a). Then, the plurality of air cylinders 731, as the support means 73 constituting the tape expanding means 72, are actuated to lower the annular frame holding member 711 to the enlargement position shown in FIG. 9(b). In accordance with this action, the annular frame F fixed onto the bearing surface 711a of the frame holding member 711 is also lowered. Thus, the dicing tape T mounted on the annular frame F is enlarged in contact with the upper edge of the expanding drum 721 (tape expanding step). As a result, the adhesive film 6 stuck to the dicing tape T undergoes a radial tensile force. When the radial tensile force acts on the adhesive film 6, the individual devices 22 become spaced from each other to form spaces S, because the semiconductor wafer 2 is divided into the individual devices 22 along the predetermined division lines 21. Since the adhesive film 6 is thus subjected to the tensile force, the adhesive film 6 is broken, with the cutting groove partly cut by the cutting blade 421b working as the starting point, and is thereby separated per device 22, even if the adhesive film 6 is not completely severed during the wafer severing step. If the adhesive film 6 is completely severed during the wafer severing step, on the other hand, the adhesive film 6 is separated reliably per device 22, since the space S is formed between the individual devices 22 by the tape expanding step.

Figure 10:
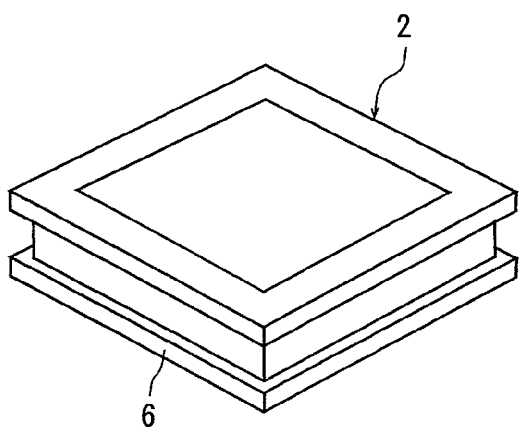
FIG. 10 is a perspective view of a device produced by the method for manufacturing a device in accordance with the present invention.

After the adhesive film separating step is performed in the above-described manner, the individually divided devices 22 (the adhesive film 6 is mounted on their back sides) are attracted by a pickup collet of a pickup means that is not shown, to release the device 22 from the dicing tape T. By so doing, the device 22 having the adhesive film 6 stuck to the back side thereof can be picked up (pickup step), as shown in FIG. 10. In this pickup step, the device 22 can be easily picked up without its contact with the adjacent device 22, because the space S between the individual devices 22 having the adhesive film 6 mounted thereon has been broadened, as stated earlier.

While the preferred embodiments of the present invention have been described in detail by reference to the accompanying drawings, it is to be understood that the invention is not limited to such embodiments, but various changes and modifications may be made without departing from the scope of the present invention.

What is claimed is:

1. A method for manufacturing a device, in which a wafer having devices formed in a plurality of regions defined by predetermined division lines formed in a lattice pattern on a surface of the wafer is divided into the individual devices along the predetermined division lines, and an adhesive film for die bonding is mounted on a back side of each device, the method comprising:

a cutting groove forming step of cutting a back side of the wafer along the predetermined division lines by a cutting blade to form cutting grooves, while leaving an uncut portion, which is thinner than a target thickness of the device, on a front side of the wafer;

a back side grinding step of grinding a back side of the wafer, which has been subjected to the cutting groove forming step, to the target thickness of the device, while allowing the cutting grooves to remain in the back side of the wafer;

an adhesive film mounting step of mounting an adhesive film to the back side of the wafer which has been subjected to the back side grinding step;

a wafer supporting step of sticking the adhesive film side of the wafer, on which the adhesive film has been mounted, to a surface of a dicing tape mounted on an annular frame;

a wafer severing step of cutting the front side of the wafer, which has been stuck to the surface of the dicing tape via the adhesive film, along the predetermined division lines by a cutting blade to sever the uncut portion, thereby dividing the wafer into the individual devices and cutting the adhesive film; and an adhesive film separating step of expanding the dicing tape, after performing the wafer severing step, to separate the adhesive film per device.

2. The method for manufacturing a device according to claim 1, wherein a thickness of the cutting blade for cutting in the wafer severing step is set to be thinner than a thickness of the cutting blade for cutting in the cutting groove forming step.

3. The method for manufacturing a device according to claim 2, wherein the adhesive film is completely severed during the wafer severing step.

* * * * *